United States Patent [19]

Yokoi

[11] Patent Number: 5,011,543

[45] Date of Patent: Apr. 30, 1991

[54] THERMOCOUPLE TYPE TEMPERATURE SENSOR

[75] Inventor: Hidetoshi Yokoi, Tokyo, Japan

[73] Assignee: Yamaha Hatsudoki Kabushiki Kaisha, Iwata, Japan

[21] Appl. No.: 195,941

[22] Filed: May 19, 1988

[30] Foreign Application Priority Data

May 22, 1987 [JP] Japan ................ 62-123662

[51] Int. Cl.⁵ .................... H01L 35/28
[52] U.S. Cl. ................ 136/211; 136/227; 136/232; 136/233
[58] Field of Search ............... 136/211, 227, 232, 233, 136/206

[56] References Cited

U.S. PATENT DOCUMENTS

| 3,553,827 | 1/1971 | Baker et al. ............. 29/573 |
| 3,923,552 | 12/1975 | Parris ..................... 136/234 |
| 3,956,017 | 5/1976 | Shigemasa .............. 136/206 |
| 4,018,624 | 4/1977 | Rizzolo ................... 136/233 |
| 4,238,957 | 12/1980 | Bailey et al. ........... 136/232 X |
| 4,365,106 | 12/1982 | Pulvari .................. 136/206 |
| 4,500,741 | 2/1985 | Morimoto et al. ..... 136/211 X |

FOREIGN PATENT DOCUMENTS

| 56-140675 | 11/1981 | Japan . |
| 58-10875 | 1/1983 | Japan . |
| 58-213479 | 12/1983 | Japan ................... 136/206 |
| 61-38810 | 9/1986 | Japan . |
| 62-26696 | 6/1987 | Japan . |

Primary Examiner—Peter A. Nelson
Attorney, Agent, or Firm—Ernest A. Beutler

[57] ABSTRACT

Several embodiments of improved thermocouples that can be formed without necessitating welding of small diameter wires. In each embodiment, the thermocouple is formed by depositing strips of dissimilar materials on an insulating base with the ends of the strips in contacting relationship to form a junction.

6 Claims, 2 Drawing Sheets

THERMOCOUPLE TYPE TEMPERATURE SENSOR

BACKGROUND OF THE INVENTION

This invention relates to a thermocouple temperature sensor and more particularly to an improved temperature sensor of the thermocouple type.

Thermocouple type sensors are used for sensing temperature in a variety of applications. Such temperature sensors consist generally of two wires that are formed from a different material and connected to form a closed circuit. The difference in the materials gives rise to an electromotive force, the magnitude of which depends upon the temperature of the materials. By utilizing this variation in electromotive force, it is possible to accurately sense temperature. However, there are certain disadvantages to the thermocouple type sensors of the type previously employed which has limited their application in certain environments.

That is, in most conventional thermocouples, the ends of the two dissimilar wires must be welded to each other to form the closed circuit. As a result, the application of this principle to very thin wires has been extremely difficult if not impossible. This is because of the difficulty of handling and welding small diameter wires.

In addition to the assembly problem, it would be desirable to employ a plurality of thermocouple type sensors at different locations so as to measure temperature distribution. However, because of the aforedescribed problems in assembly, thermocouples have not been as widely utilized for such an application as measuring temperature distribution as would be desirable. Furthermore, the problem of welding small diameter wire ends to each other and then employing such a thermocouple in application gives rise to the necessity to ensure against shocks and other loading of the fine diameter wires when temperatures are being measured.

It is, therefore, a principal object of this invention to produce a thermocouple which can be manufactured without the necessity of welding small diameter wires.

It is a further object of this invention to provide a very small thermocouple which nevertheless will be able to withstand shocks in application.

It is a yet further object of this invention to provide an improved type of thermocouple for measuring temperature distribution or average temperatures of large bodies.

SUMMARY OF THE INVENTION

This invention is adapted to be embodied in a thermocouple that is comprised of a base, a first metal strip deposited on the base and a second metal strip that is deposited on the base in spaced relation to the first strip along at least a major portion of the length of the strips. The metals of the strips have different thermoelectric characteristics and portions of the strips are in contact to form the thermocouple.

DETAILED DESCRIPTION OF THE PREFERRED EMBODIMENTS

Figure 1:
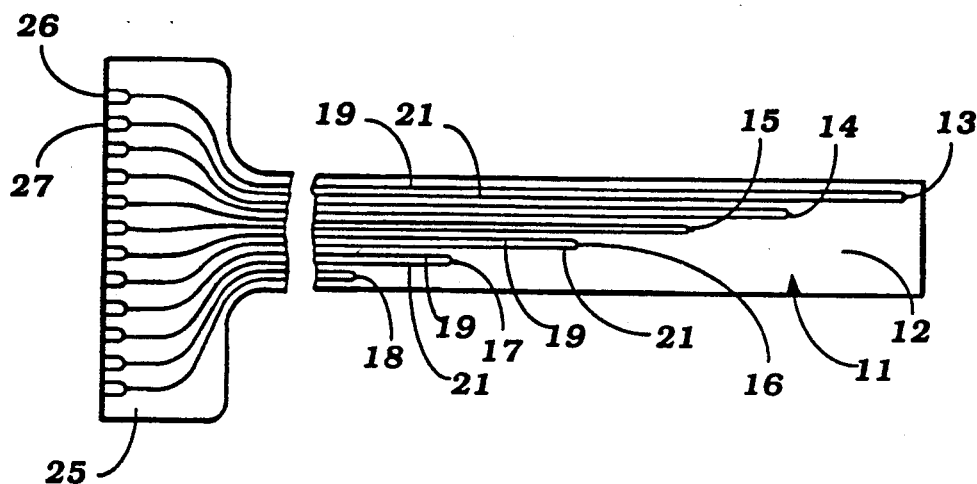
FIG. 1 is a side elevational view of a thermocouple constructed in accordance with a first embodiment of the invention.
Figure 2:
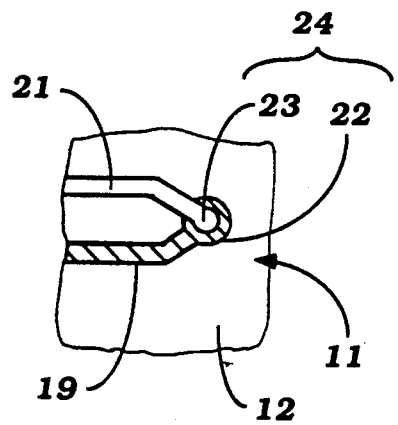
FIG. 2 is an enlarged view showing the manner in which the metals of the thermocouple are in contact.
Figure 3:
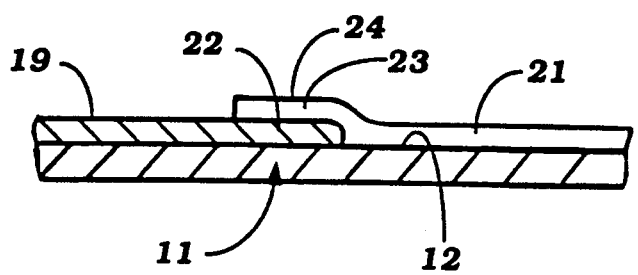
FIG. 3 is a still further enlarged cross-sectional view of the connecting joint shown in FIG. 2.

Referring first to FIGS. 1 through 3, a thermocouple constructed in accordance with a first embodiment of the invention is identified generally by the reference numeral 11. The thermocouple 11 is, in this particular embodiment, particularly adapted to measure the temperature gradient or distribution along a given area. It is to be understood, however, that certain aspects of the invention may be utilized with thermocouples that are employed for other purposes.

The thermocouple 11 is comprised of a base 12 that is primarily formed from an electrical insulating material that lends itself to the deposition of metals upon it by means of different plating or deposition techniques. The base material 12 also should have sufficient strength for the intended purpose and may be formed from such plastics as polyimides or may be formed of plastic composite materials such as glass epoxy, glass phenol, glass polyimide, paper phenol and paper epoxy. Also, inorganic materials such as ceramics, glass or asbestos may be employed for the base depending upon the specific application.

Deposited upon the base 12, in manners to be described, are a plurality of strips of thermocouples having different lengths, or, alternatively, their junctions at different locations along the length of the base 12. In the illustrated embodiment, there are provided six of such strips and these are indicated by the reference numerals 13, 14, 15, 16, 17 and 18. As may be best seen in FIG. 2, each strip 13 through 18 is comprised of a first layer of material 19 that, in the illustrated embodiment, extends in a generally linear fashion and a second layer 21 of a metal having a different electromotive force characteristic. The strips 19 and 21 extend in generally parallel relationship but have respective end portions 22 and 23 that are in overlapping relationship so as to form a junction 24. As a result, the electromotive force generated by temperature variations will cause different electromotive outputs from the circuit comprised of the layers 19 and 21 and junction 24.

The materials from which the strips 19 and 21 may be formed can be of any type which has different electromotive forces, as aforenoted. For example, the materials may comprise copper-constantan, iron-constantan, platinum-platinum rhodium, chromel-alumel and chromel-constantan. Any other materials normally employed for thermocouples can be employed depending upon the specific application.

It should be noted that the base 12 has an enlarged portion 25 at the end opposite the junctions 24. This enlarged end permits the ends of the individual layers 19 and 21 to be provided with respective terminals 26 and 27 for connection to an appropriate circuit and metering device (not shown) for reading out the temperature dependent upon the electromotive force generated by the individual thermocouple junctions 24.

The layers 19 and 21 may each be deposited on the base 12 by any suitable method such as by plating, vacuum deposition, sputtering, or combinations thereof. For example, if the layer 19 is copper and the layer 21 is constantan, the thermocouple material 19 (copper) is first chemically plated on the base. This is done by applying a resist to the base and then etching that resist in the desired pattern for the layers 19. The thus treated base is then plated to apply the copper layer 19 to the base 12.

After the copper layer has been formed, a resist is formed on the plated base on all areas except in the area of the junction 24. This resist is thereafter removed in the area where the layer 21 is to be formed and the layer 21 is applied by sputtering or other suitable treatment in the predetermined pattern. Then, the resist is removed and the thermocouple 11 is ready for use.

If the thermocouple metals are chromel and alumel, a sputtering method may be used for applying both materials. Alternatively, other methods for depositing the layers on the base 12 may be employed depending upon the materials being used.

In connection with the formation of the junction 24, the surface area of this junction may be kept extremely small being no wider than the overlapping areas of a pair of lines formed from the respective materials. Aternatively, the area may be greater by expanding the ends of the individual layers 19 and 21 and as the area of the thermocouple becomes larger, it is possible to measure the average temperature of the area encompassed by the junction 24.

Figure 4:
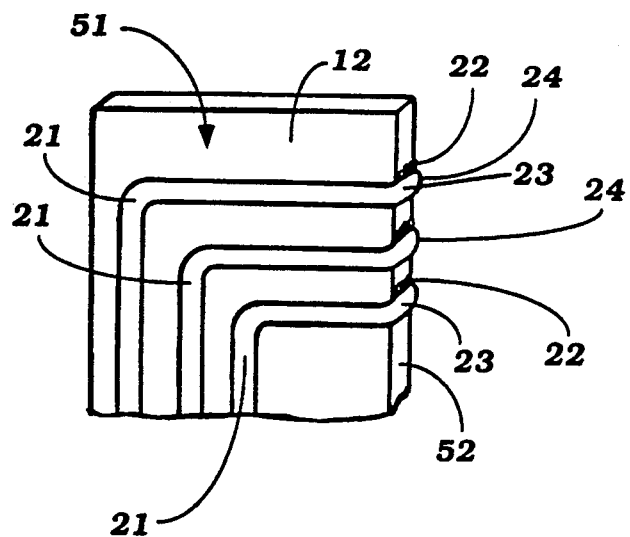
FIG. 4 is a perspective view of a thermocouple constructed in accordance with a second embodiment of the invention.
Figure 5:
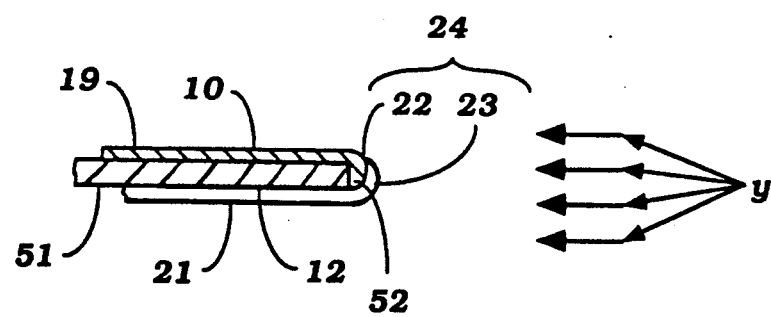
FIG. 5 is an enlarged cross-section view of the thermocouple shown in FIG. 4 and shows the manner in which the dissimilar metals are in contact with each other.

Turning now to FIGS. 4 and 5, a thermocouple constructed in accordance with yet another embodiment of the invention is identified generally by the reference numeral 51. Like the previous embodiment, the thermocouple 51 is comprised of a base 12 that may be formed from an electrically insulating material and which has first layers of material 19 deposited on one side of the base 12. These layers are wrapped around the end to form end portions 22. In a like manner, the layers 21 are formed on the other side of the base 12 and have their end portions wrapped around an edge 52 of the base 12 and overlap the end portions 22 as at 23 to form the junction 24. Then, the method by which the individual layers 19 and 21 are deposited on the base 12 may vary depending upon the materials employed, as aforedescribed. Since the junctions 24 are disposed along the edge 52, it is possible to sense the temperature variation of a flowing fluid that moves in the direction y as seen in FIG. 5.

It should be readily apparent from the foregoing description that it is possible, by means of the construction illustrated, to provide very small thermocouples corresponding to wire diameters of 100 μm easily and accurately without requiring welding of extremely small diameter wire elements. Also, because the thermocouple is formed on a base, handling is easy and it is possible to form the thermocouple as a chip or unit for a sensor for measuring plural point temperature distribution in addition to ordinary one point temperature sensing. Also, the device may be employed as a touch type sensor by applying it like a seal on the object to be measured. Also, one embodiment has been illustrated which is particularly advantageous in measuring the temperature distribution of fluid flowing, for example through a pipe or in a vessel. Also, the devices can be utilized as temperature sensors in injection molding and various other applications.

It is to be understood that the foregoing is the description of preferred embodiments of the invention and various changes and modifications may be made without departing from the spirit and scope of the invention, as defined by the appended claims.

I claim:

1. A thermocouple comprised of a base, a first metal strip having an elongated portion extending from one end of said base and deposited on said base, a second metal strip having an elongated portion extending from said one end of said base and deposited on said base in spaced relationship to said first strip along at least a major portion of its length, the metals of said strips having different theoelectric characteristics, portions of said strips spaced from said one end of said base being in contacting relationship to form a thermocouple that generates an electrical potential across the unconnected ends of said strips at said one end of said base depending on the temperature at said contacting portions.

2. A thermocouple as set forth in claim 1 wherein the contacting portions of the strip overlie each other.

3. A thermocouple comprised of a base, a first metal strip deposited on said base, a second metal strip deposited on said base in spaced relationship to said first strip along at least a major portion of its length, the metals of said strips having different thermoelectric characteristics, portions of said strips being in contacting relationship to form a thermocouple that generates an electrical potential across the unconnected ends of said strips depending on the temperature at said contacting portions, said strips being deposited on opposite sides of said base and contact at the edge of said base.

4. A thermocouple as set forth in claim 3 wherein the contacting portions of the strip overlie each other.

5. A thermocouple as set forth in claim 1 wherein there are a plurality of pairs of dissimilar metal strips each having contacting portions formed on the same base at different locations from the one end.

6. A thermocouple as set forth in claim 5 wherein the pairs are in contacting relationship by having one end overlying the other.

* * * * *

UNITED STATES PATENT AND TRADEMARK OFFICE
CERTIFICATE OF CORRECTION

PATENT NO. : 5,011,543
DATED : April 30, 1991
INVENTOR(S) : Hidetoshi Yokoi

It is certified that error appears in the above-identified patent and that said Letters Patent is hereby corrected as shown below:

On the Title page, please correct the following:

item [73] Assignee: Yamaha Hatsudoki Kabushiki Kaisha
Iwata, Japan, ½ interest --.

Signed and Sealed this

Fifteenth Day of June, 1993

Attest:

MICHAEL K. KIRK

Attesting Officer        Acting Commissioner of Patents and Trademarks